United States Patent [19]

Querry

[11] 4,042,884

[45] Aug. 16, 1977

[54] PHASE DEMODULATOR WITH OFFSET FREQUENCY REFERENCE OSCILLATOR

[75] Inventor: Lester R. Querry, Laurel, Md.

[73] Assignee: Rixon, Inc., Silver Spring, Md.

[21] Appl. No.: 551,079

[22] Filed: Feb. 20, 1975

[51] Int. Cl.² .................. H03D 3/06; H04L 27/22
[52] U.S. Cl. .................. 329/122; 325/346;
325/419; 329/107; 331/23; 331/25
[58] Field of Search .................. 329/122–125,
329/104, 107; 331/23, 25; 325/346, 349, 419, 423

[56] References Cited

U.S. PATENT DOCUMENTS

| | | |
|---|---|---|
| 3,204,185 | 8/1965 | Robinson .................. 329/122 X |
| 3,626,301 | 12/1971 | Develet, Jr. .................. 329/122 X |
| 3,906,380 | 9/1975 | Querry et al. .................. 329/122 X |

*Primary Examiner*—Siegfried H. Grimm

*Attorney, Agent, or Firm*—Ross F. Hunt, Jr.; Kevin McMahon

[57] ABSTRACT

A phase-locked demodulator for demodulating a phase-difference modulated carrier having a repeated phase offset increment introduced therein. The demodulator includes, in common with conventional phase locked demodulators, a mixer having a first input connected to receive the modulated carrier and a reference carrier generator such as a voltage controlled oscillator (VCO) connected in a phase-locked feedback loop forming the second input to the mixer. In order to reduce the number of output levels, the VCO is tuned to a frequency $Fr = Fc \pm Fb[(\alpha)/360]$ where Fc is the carrier frequency, Fb is the baud rate and $\alpha$ is the repeated phase offset. In this way the phase offset increment introduced into the modulated carrier is substantially cancelled out thereby leaving only the phase changes containing data information.

2 Claims, 8 Drawing Figures

PHASE DEMODULATOR WITH OFFSET FREQUENCY REFERENCE OSCILLATOR

FIELD OF THE INVENTION

The present invention relates to phase demodulators and, more particularly, to a phase-locked demodulator utilizing a shifted reference carrier.

BACKGROUND OF THE INVENTION

As discussed in commonly assigned, co-pending application Ser. No. 461,427 filed on Apr. 16, 1974, now U.S. Pat. No. 3,906,380, issued Sept. 16, 1975 conventional coherent phase demodulators employ a locally generated, fixed reference carrier which is phase-locked to the signal carrier. The output of the demodulator is proportional to the cosine of the phase difference between the modulated signal carrier and the reference carrier. Thus, when receiving a modulated carrier having phasors A and B at 0° and 180°, respectively, the output of the modulator consists of two levels, viz., a first level equal to cos 0° and a second level equal to cos 180°.

In phase difference modulated carrier systems employing a repeated phase offset, phase incrementing is utilized to provide clocking information. As is described in more detail hereinbelow, in systems of this type having two phase states for data and employing a repeated phase offset of 45° for each baud interval, the demodulator will see eight different absolute phasors or phase states and will produce five output levels. Similarly, for a modulation system of this type having two phase states and a repeated phase change of 30° for each baud interval, the demodulator will see twelve different absolute phase states and a minimum of six output states will be provided for decoding.

Application Ser. No. 461,427, referred to above, concerns a demodulation system such as described wherein repeated phase shifts are introduced in the reference carrier which track the known repeated phase shifts in the modulated carrier so that the effect of the repeated phase shifts on data information is cancelled. More particularly, the repeated phase shifts introduced by the modulator for the purpose of providing clock information are cancelled in the demodulator, which includes a VCO tuned to the unmodulated carrier frequency and an incrementing circuit that produces the cancelling phase shifts referred to. As a result, the number of output states to be decoded is reduced and the noise performance of the receiver improved. More specifically, considering the two examples referred to above, in a modulation system having two phase states and a repeated phase change of 45°, repeated 45° phase shifts would be introduced in the receiver and the output states reduced to two, thereby simplifying the decoding process and improving noise performance by 3db. Similar results are obtained with a modulation system having two phase states for data and a repeated phase change of 30° for each baud interval, the minimum of six output states being reduced to 2. Decoding in this instance can be performed by simply slicing the output levels about the mid-point (Ov) as opposed to employing level comparators for each of the six levels as required in the prior art.

SUMMARY OF THE INVENTION

In accordance with the invention, a phase demodulator is provided which produces substantially the same improved results as produced by the demodulator of application Ser. No. 461,427 but with the elimination of the phase incrementing circuit. More specifically, according to the invention, the voltage controlled oscillator of the feedback circuit of the demodulator is tuned to the average frequency of the incremented carrier. In particular, the VCO is tuned to the frequency $Fr = Fc \pm Fb[(\alpha/360)]$, wherein Fc is the unmodulated carrier signal, Fb is the baud rate and $\alpha$ is the increment angle, in degrees, of the shifted reference carrier. Apart from this change the demodulator of the invention can be implemented in the same manner as disclosed in the application referred to.

Additional features and advantages of the invention will be set forth in, or apparent from, the detailed description of preferred embodiments of the invention found below.

DESCRIPTION OF THE PREFERRED EMBODIMENTS

Figure 1:
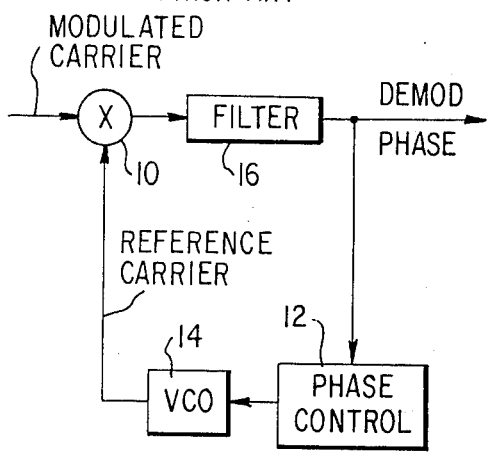
FIG. 1 is a block diagram of a conventional phase-locked demodulator.

Referring to FIG. 1, a conventional coherent phase demodulator is shown which includes a product modulator 10 which is connected to receive the modulated carrier as well as a reference carrier generated in a feedback loop which includes a phase control network 12 and a variable frequency, voltage-controlled oscillator 14. The output of modulator 10 is connected to a filer 16 whose output constituted the demodulated phase signal. As shown, the output of filter 16 is also connected to phase control network 12. Demodulators such as shown in FIG. 1 employ the locally generated fixed reference carrier, produced by the feedback loop and phase locked to the signal carrier, to provide demodulation. The output of the demodulator, i.e., the output of filter 16, is equivalent to the cosine of the phase difference between the modulated signal carrier and the reference carrier.

Figure 2:
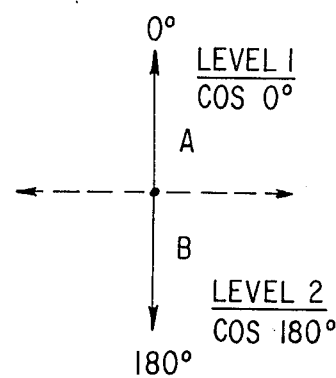
FIGS. 2 to 4 are phasor diagrams used in explaining the operation of prior art phase demodulators.
Figure 3:
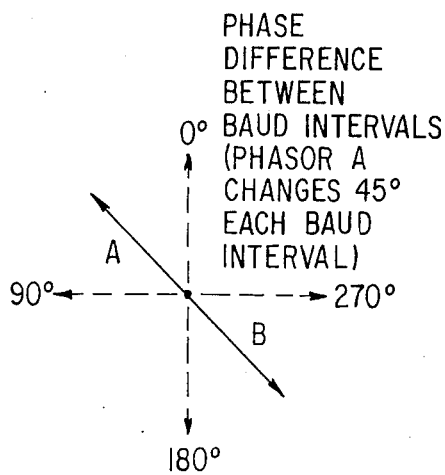
Figure 4:
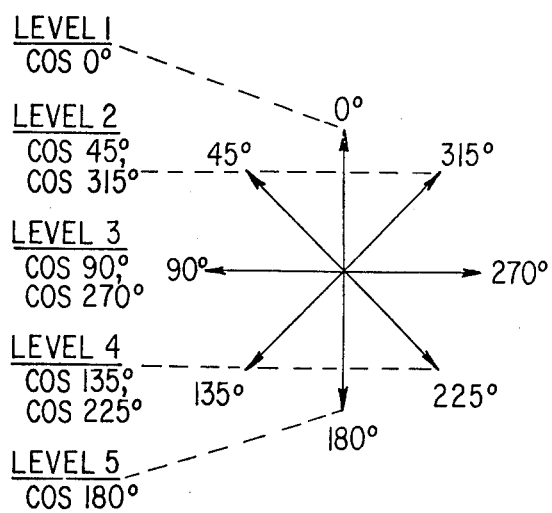

When a demodulator such as shown in FIG. 1 receives a modulated carrier having phasors A and B as illustrated in FIG. 2, the demodulated output consists of two levels, viz., a first level (level 1) equal to cos 0° and a second level (level 2) equal to cos 180°. With systems receiving a phase-difference modulated carrier with a repeated phase offset, the demodulator will see a plurality of different absolute phasors and will produce a corresponding number of outputs, depending on the repeated phase offset. For example, where the phase angle of phasor A is incremented by 45° for each baud interval, i.e., where the repeated phase interval is 45°, as shown in FIG. 3, the demodulator will see eight absolute phasors and five output levels (see FIG. 4).

Figure 6:
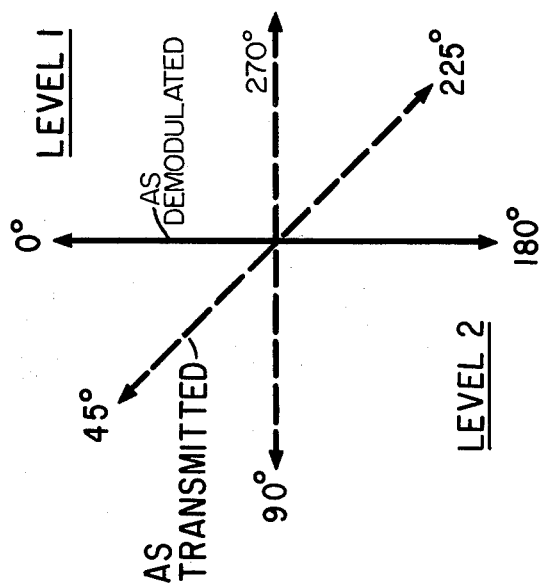
FIG. 6 is a phasor diagram used in explaining the operation of the demodulator of FIG. 5.
Figure 5:
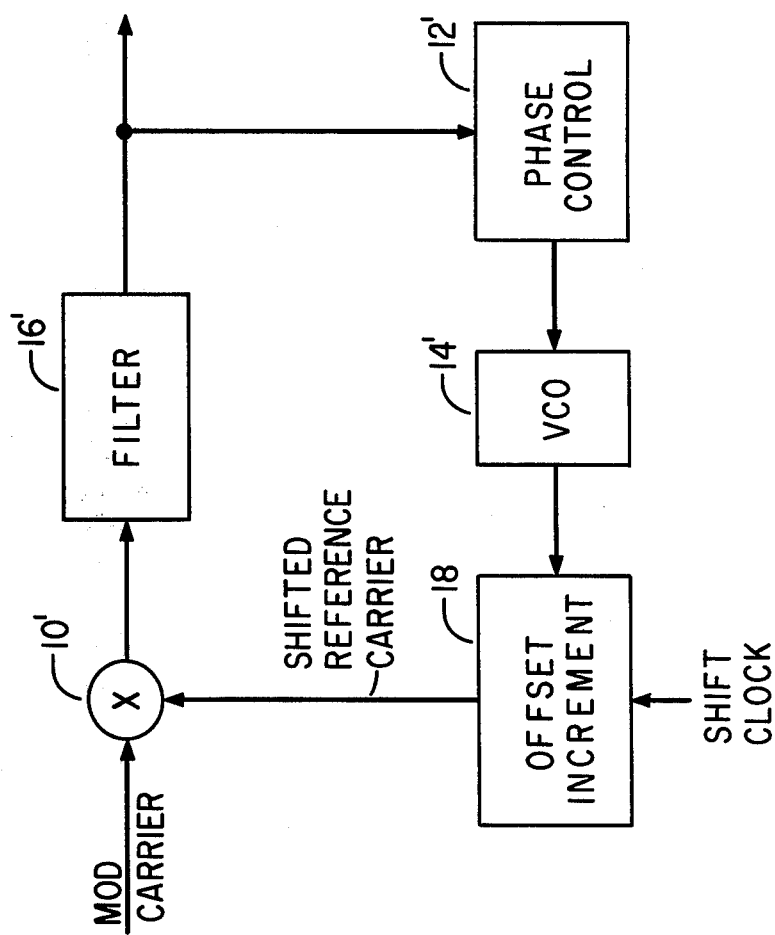
FIG. 5 is a block diagram of a phase-locked demodulator with a shifted reference carrier, in accordance with the invention disclosed in application Ser. No. 461,427.

As discussed above, an important feature of the invention disclosed in application Ser. No. 461,427 concerns shifting the reference carrier with a repeated phase offset increment equal to the known phase offset increment introduced into the modulator, to thereby cancel the offset in the modulated carrier. To this end, a demodulator is provided such as shown in FIG. 5 wherein elements similar to those shown in FIG. 1 have been given the same numbers with primes attached. The demodulator of FIG. 5 is the same as that of FIG. 1 apart from the provision therein of an offset increment circuit 18 which, under the control of a shift clock, provides a repeated phase offset equal to that introduced into the modulator, hence cancelling the modulated carrier offset and reducing the number of demodulator output levels to two, as shown in FIG. 6. It will be appreciated that by reducing the number of demodulator output levels from five to two substantially simplifies the phase difference measurement.

In accordance with the present invention, substantially the same results are produced as are produced by the demodulator of FIG. 5, but with a significant simplification in the circuitry used. More specifically, in the demodulator of FIG. 5, voltage controlled oscillator (VCO) 14' is tuned to the unmodulated carrier frequency of the phase modulated carrier and the offsetting increment is produced by phase offset increment circuit 18. In contrast, in the demodulator of this invention, the phase increment circuit is eliminated and the voltage controlled oscillator is tuned to the average frequency of the phase incremented carrier. In particular, referring to FIG. 7, wherein elements similar to those of FIGS. 1 and 5 are given the same numbers with double primes attached, VCO 14" is tuned to the reference frequency $Fr = Fc \pm Fb[(\alpha 360)]$, where Fc is the unmodulated carrier frequency, Fb is the offset increment rate or baud rate, and $\alpha$ is the increment angle of the shifted reference carrier, the plus or minus sign indicating a positive (phase advance) or negative (phase retard) increment. The demodulator circuit of FIG. 7 is thus similar to that of FIG. 5 except that the VCO is not tuned to the frequency of the unmodulated carrier, and phase incrementing circuit 18 is eliminated.

The present invention can perhaps be best understood by considering an actual numerical example. First, taking the circuit of FIG. 5, and assuming that the incoming signal, when unmodulated, is 1800 Hz (Fc=1800), that the phase increment rate or baud rate is 1200 bits per second (or BPS) (Fb=1200), and that the increment angle of the shifted reference carrier is plus 45° ($\alpha=45$), VCO 14' will be tuned to 1800 Hz and phase incrementing circuit 18 will advance the phase of the 1800 Hz signal by 45°, 1200 times per second.

Figures 7, 8:
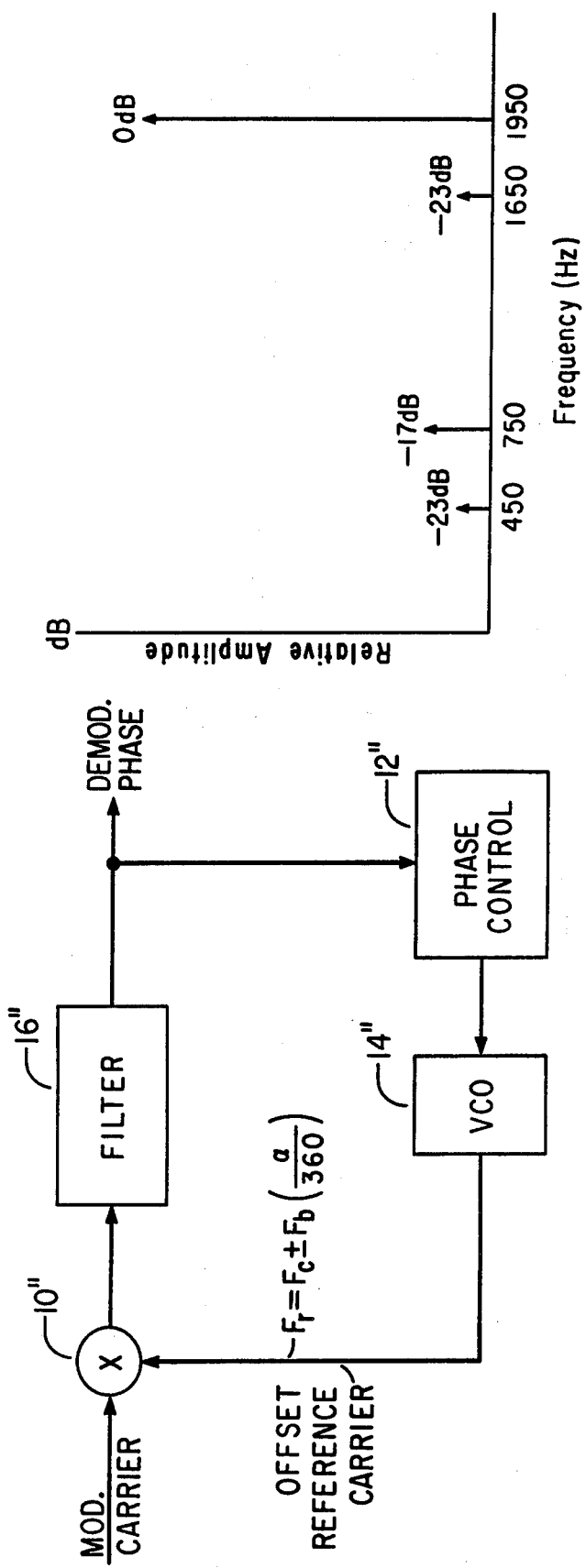
FIG. 7 is a block diagram of a phase-locked demodulator with an offset frequency reference carrier, in accordance with the present invention.
FIG. 8 is an amplitude-frequency plot used in explaining the operation of the demodulator of FIG. 7.

Considering now the demodulator of FIG. 7 and using the same values as above, VCO 14" is tuned to the reference frequency $Fr = 1800 + 1200[(45/360)] = 1950$ Hz. Under these circumstances, the demodulator circuit of FIG. 7 functions in the same way as that of FIG. 5 with a slight reduction in performance. That this is so clearly shown by comparing the frequency spectrum of the phase shifted reference carrier input to mixer 10' of FIG. 5 with the frequency shifted reference carrier of the present invention. Thus, referring to FIG. 8, for the exemplary values considered above, i.e., for a reference carrier of 1800 Hz, with phase advance increments of 45° occurring 1200 times per second, the frequency spectrum is as illustrated. It is apparent from FIG. 8 that the phase shifted reference carrier is primarily a frequency of 1950 Hz and consequently, a single frequency at 1950 Hz such as produced in accordance with the present invention provides an almost equivalent performance as the offset incremented phase carrier demodulator of FIG. 5.

The phase control network 12" may take one of the forms disclosed in application Ser. No. 461,427 and reference is made to that application for a further description of these circuits. The remaining circuitry is, of course, entirely conventional.

Although the present invention has been described relative to exemplary embodiments thereof, it will be understood by those skilled in the art that variations and modifications can be effected in these embodiments without departing from the scope and spirit of the invention.

I claim:

1. A method of demodulating a phase-difference modulated carrier signal having a carrier frequency Fc and a repeated phase offset increment angle $\alpha$ generated at a baud rate Fb, said method comprising the steps of generating a reference carrier having a frequency $Fr = Fc \pm Fb[(\alpha/360)]$, applying the received modulated carrier to one input of a mixer, and applying said reference carrier to a second input to said mixer so as to substantially cancel the repeated phase offset increment and produce a 2-level demodulated signal.

2. A method as claimed in claim 1 wherein the step of generating said reference carrier comprises using a voltage controlled oscillator connected in a feedback loop to said second input to said mixer and tuned to said reference carrier frequency.

* * * * *